(12) United States Patent
Miyajima

(10) Patent No.: US 7,602,476 B2
(45) Date of Patent: Oct. 13, 2009

(54) SUBSTRATE-HOLDING TECHNIQUE

(75) Inventor: Yoshikazu Miyajima, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/829,271

(22) Filed: Jul. 27, 2007

(65) Prior Publication Data

US 2008/0018036 A1    Jan. 24, 2008

Related U.S. Application Data

(62) Division of application No. 11/002,900, filed on Dec. 3, 2004, now Pat. No. 7,379,162.

(30) Foreign Application Priority Data

Dec. 8, 2003    (JP)    ............................. 2003-409446

(51) Int. Cl.
  *G03B 27/58*    (2006.01)
  *G03B 27/42*    (2006.01)
  *G03B 27/62*    (2006.01)

(52) U.S. Cl. .............................. 355/72; 355/53; 355/75

(58) Field of Classification Search .................. 355/30, 355/53, 72–76; 310/10, 12; 361/234
See application file for complete search history.

(56) References Cited

U.S. PATENT DOCUMENTS

| 5,610,683 | A | 3/1997 | Takahashi ..................... 355/53 |
| 6,590,355 | B1 * | 7/2003 | Kikuchi et al. ............... 318/135 |
| 2001/0013772 | A1 * | 8/2001 | Sugiyama et al. ........ 324/158.1 |
| 2004/0114124 | A1 | 6/2004 | Hoeks et al. .................. 355/75 |
| 2004/0160582 | A1 * | 8/2004 | Lof et al. ...................... 355/30 |
| 2005/0052632 | A1 | 3/2005 | Miyajima ..................... 355/53 |
| 2005/0122505 | A1 | 6/2005 | Miyajima ..................... 355/72 |
| 2007/0132970 | A1 * | 6/2007 | Lof et al. ...................... 355/53 |

FOREIGN PATENT DOCUMENTS

| JP | 5-251544 | 9/1993 |
| JP | 6-124873 | 5/1994 |
| JP | 6-168866 | 6/1994 |
| JP | 09-066429 | 3/1997 |
| JP | 10-92728 | 4/1998 |
| JP | 10-135316 | 5/1998 |
| JP | 10-303114 | 11/1998 |
| JP | 10-340846 | 12/1998 |
| JP | 2003-332213 | 11/2003 |

OTHER PUBLICATIONS

Japanese Office Action dated Nov. 28, 2007, issued in corresponding Japanese patent application No. 2003-409446, with an English translation.
Japanese Office Action dated Apr. 4, 2007, issued in corresponding Japanese patent application No. 2003-409446, with English translation.

* cited by examiner

*Primary Examiner*—Hung Henry Nguyen
(74) *Attorney, Agent, or Firm*—Fitzpatrick, Cella, Harper & Scinto

(57) ABSTRACT

A substrate holding apparatus which contacts an undersurface of a substrate and holds the substrate, at least a portion of a top surface of the substrate being immersed in liquid. The apparatus includes a chuck unit for supporting the substrate, and a groove, arranged along an outer periphery of a substrate supporting surface of the chuck unit, for storing a fluorinated inert refrigerant, fluorinated oil or a gelatinous polymer material.

4 Claims, 11 Drawing Sheets

ENLARGED DIAGRAM OF SECTION A

SECTION A    5D    5C

ENLARGED DIAGRAM OF SECTION A 5P    17    5D 17    5E    5E    5C

ENLARGED DIAGRAM OF SECTION A

SECTION A     5D     5C

SECTION A     5E     5E     5C

ENLARGED DIAGRAM OF SECTION A

ENLARGED DIAGRAM OF SECTION A

FIG. 11H

ENLARGED DIAGRAM OF SECTION A

SUBSTRATE-HOLDING TECHNIQUE

This application is a divisional application of copending U.S. patent application Ser. No. 11/002,900, filed Dec. 3, 2004.

This application claims foreign priority based on Japanese Patent Application No. 2003-409446, filed Dec. 8, 2003, the contents of which are incorporated herein by reference.

BACKGROUND OF THE INVENTION

1. Field of the Invention

The present invention relates to a substrate holding technique adapted, for example, to exposure apparatuses used for fabricating devices having micropatterns, such as LSIs (large-scale integrations). In particular, the present invention relates to a substrate-holding technique used in, for example, a liquid-immersion exposure apparatus for projecting a pattern of an original onto a photosensitive substrate via a liquid layer.

2. Description of the Related Art

A typical liquid-immersion exposure apparatus is provided with a light source and an optical projection unit to achieve higher resolution or high focal depth. Japanese Patent Laid-Open Nos. 6-124873 and 6-168866 disclose examples of such a liquid-immersion exposure apparatus.

A conventional technique related to the present invention will now be described with reference to FIGS. 9 to 13.

FIG. 9 illustrates a typical liquid-immersion exposure apparatus, which includes an illumination unit 1; a reticle stage 2; a step-and-repeat lens 3; a main body 4; and a wafer stage 5. The illumination unit 1 receives a light beam from a light source, not shown in the drawing, and emits the light beam towards a reticle, which is not shown in the drawing, provided in the reticle stage 2. The reticle includes an exposure pattern of an original. The reticle stage 2 photoscans the reticle against a wafer 12 shown in FIG. 10, i.e., a photosensitive substrate, at a predetermined reduction rate. The step-and-repeat lens 3 projects the original pattern included in the reticle towards the wafer 12 at a reduced rate. The main body 4 supports the reticle stage 2, the step-and-repeat lens 3, and the wafer stage 5. The wafer stage S shifts the wafer 12 to an exposure position in a step-by-step manner, and scans the wafer 12 in synchronization with the scanning of the reticle.

Referring to FIG. 10, the wafer stage 5 includes a stage base 5S, a wafer chuck 5C, and a slider 5B. The wafer chuck 5C is disposed on the slider 5B. The wafer chuck 5C holds the wafer 12 in place and also contains immersion liquid. The wafer chuck 5C is movable while holding the wafer 12 in place, and moreover, the wafer chuck 5C can be detached from the slider 5B.

The exposure apparatus further includes an alignment scope 6; a focus scope 7; an x-axis mirror bar 8; and a y-axis mirror bar 9.

The alignment scope 6 is a microscope which measures an alignment mark on the wafer 12 and an alignment reference mark on the wafer stage 5 so as to determine the alignment position of the wafer 12 with respect to a reference point and the alignment position between the reticle and the wafer 12. The focus scope 7 determines the surface structure of the wafer 12 and performs a focus measurement in an optical-axis direction (positional) measurement on the surface of the wafer 12 with respect to the optical-axis direction.

The x-axis mirror bar 8 functions as a target for determining the position of the slider 5B in the x-axis direction via a laser interferometer. On the other hand, the y-axis mirror bar 9 functions as a target for determining the position of the slider 5B in the y-axis direction.

The upper surface of the slider 5B is provided with a stage reference marker 10 and a light-intensity sensor 11. The stage reference marker 10 is provided with a target used for stage alignment. The light-intensity sensor 11 calibrates the intensity of light before an exposure operation so as to compensate for the light intensity. The pattern in the reticle is projected and transferred to the wafer 12 via the step-and-repeat lens 3. Thus, the wafer 12, i.e., a single-crystal silicon substrate, has a resist pattern disposed thereon.

In FIG. 9, the wafer chuck 5C and the wafer 12 on the slider 5B are illustrated in cross section so as to provide an easier understanding of the relationship among the step-and-repeat lens 3, a light beam from the focus scope 7, and the wafer 12.

The exposure apparatus further includes a wafer-shifting robot 13 for supplying and retrieving the wafer 12; an immersion-liquid tank 14 for storing the immersion liquid; and a liquid supplying/retrieving unit 15 for supplying the immersion liquid to the wafer chuck 5C from the immersion-liquid tank 14 or retrieving the immersion liquid from the wafer chuck 5C back to the immersion-liquid tank 14.

FIGS. 11A to 11H illustrate the liquid-immersion exposure operation performed on the wafer 12.

Referring to FIG. 11A, an alignment operation is performed in the wafer stage 5 so that an alignment measurement and a focus measurement can be performed on the wafer 12 disposed on the wafer stage 5. In this state, the immersion liquid is not present between the wafer 12 and the step-and-repeat lens 3. If the immersion liquid is present, the measurements become difficult, since the difference in the index of refraction between the resist and the immersion liquid is small. For this reason, the alignment measurement and the focus measurement are performed without any of the immersion liquid being supplied.

Referring to FIG. 11B, after the alignment operation is completed, the wafer 12 on the wafer stage 5 is shifted to a position directly below the liquid supplying/retrieving unit 15. After this shifting process, the immersion-liquid tank 14 supplies immersion liquid having a refraction of index of more than one to the liquid supplying/retrieving unit 15. The liquid supplying/retrieving unit 15 then supplies droplets of the immersion liquid to the wafer chuck 5C until the liquid layer on the surface of the wafer 12 reaches a predetermined thickness. Accordingly, liquid having a refraction of index greater than the air fills a space provided between the step-and-repeat lens 3 and the wafer 12 such that the numerical aperture of the step-and-repeat lens 3 is enlarged. This contributes to higher resolution.

Referring to FIG. 11C, the wafer 12 is shifted to an exposure position in a state where the immersion liquid is disposed on the wafer 12. Subsequently, referring to FIG. 11D, a step-and-repeat exposure process or a step-and-scan exposure process is performed. Referring to FIG. 11E, after the exposure process is completed, the slider 5B is shifted to a retrieving position of the wafer-shifting robot 13 such that the wafer 12 is retrieved. Referring to FIG. 11F, after the retrieving process, the retrieved wafer 12 is ejected from the exposure apparatus in order to perform the subsequent step.

Referring to FIG. 11G, a subsequent wafer 12 is transferred to the wafer chuck 5C on the wafer stage 5 via the wafer-shifting robot 13. Referring to FIG. 11H, the subsequent wafer 12 is shifted to the initial position for the alignment and focus measurements. Thus, the exposure operation illustrated in FIGS. 11A to 11F is repeated. Accordingly, the liquid-immersion exposure operation is performed on each wafer 12 in the manner described above.

FIGS. 12A, 12B, and 13 illustrate detailed examples of the wafer chuck 5C shown in FIGS. 9 and 10. Specifically, FIGS.

12A, 12B, and 13 illustrate how immersion liquid 16 may leak into a space between the undersurface of the wafer 12 and a wafer suction unit.

In the example shown in FIGS. 12A and 12B, a vacuum-chuck component 5D provided in the wafer chuck 5C vacuums the wafer 12 so as to support the wafer 12. A circumferential projection (a ring-shaped projection) 5P is provided around the outer periphery of the vacuum-chuck component 5D. If foreign matter attaches to the circumferential projection 5P or if a scratch is present on the circumferential projection 5P, a leakage 105F may occur. Such a leakage 105F may cause the immersion liquid 16 to enter the openings provided in the vacuum-chuck component 5D, and may thus lead to vacuum errors. Moreover, such a leakage 105F may, for example, lower the liquid level of the layer of the immersion liquid 16.

On the other hand, in the example shown in FIG. 13, an electrostatic-chuck component 5E provided in the wafer chuck 5C supports the wafer 12 with an electrostatic suction force. Such a technique is also problematic in that the immersion liquid 16 may enter the electrostatic-chuck component 5E so as to cause, for example, a leakage of voltage or lowering the liquid level of the layer of the immersion liquid 16.

SUMMARY OF THE INVENTION

It is an exemplified object of the present invention to provide a substrate-holding technique which prevents liquid from reaching the undersurface of a substrate.

According to the present invention, the foregoing object is attained by providing a substrate holder, in which a substrate is immersed in liquid and an undersurface of the substrate is in contact with the substrate holder so as to be held by the substrate holder. Such a substrate holder includes a chuck unit to which the substrate is attracted; and a blocking unit for preventing the liquid from entering a space between the undersurface of the substrate and the chuck unit.

According to the present invention, a substrate-holding technique that prevents immersion liquid from entering the undersurface of a substrate is provided.

Further objects, features and advantages of the present invention will become apparent from the following description of the preferred embodiments (with reference to the attached drawings). In the description, reference is made to the accompanying drawings, which form a part thereof, and which illustrate an example of the invention. Such an example, however, is not exhaustive of the various embodiments of the invention, and therefore, reference is made to the claims which following the description for determining the scope of the invention.

BRIEF DESCRIPTION OF THE DRAWINGS

The accompanying drawings, which are incorporated in and constitute a part of the specification, illustrate embodiments of the present invention and, together with the description, serve to explain the principles of the invention.

FIGS. 11A to 11H are diagrams illustrating an exposure operation performed by the exposure apparatus shown in FIG. 9.

DESCRIPTION OF THE PREFERRED EMBODIMENTS

Preferred embodiments of the present invention will now be described with reference to the drawings.

First Embodiment

Figure 1A:
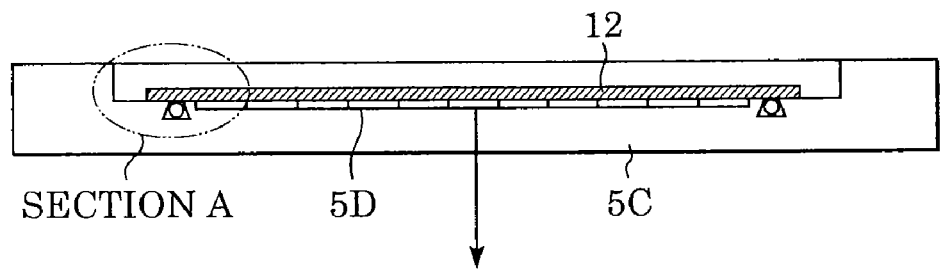
FIGS. 1A and 1B are cross-sectional views each illustrating a wafer chuck provided with a vacuum-chuck component and a sealing unit for preventing immersion-liquid leakage according to a first embodiment of the present invention.
Figure 1B:
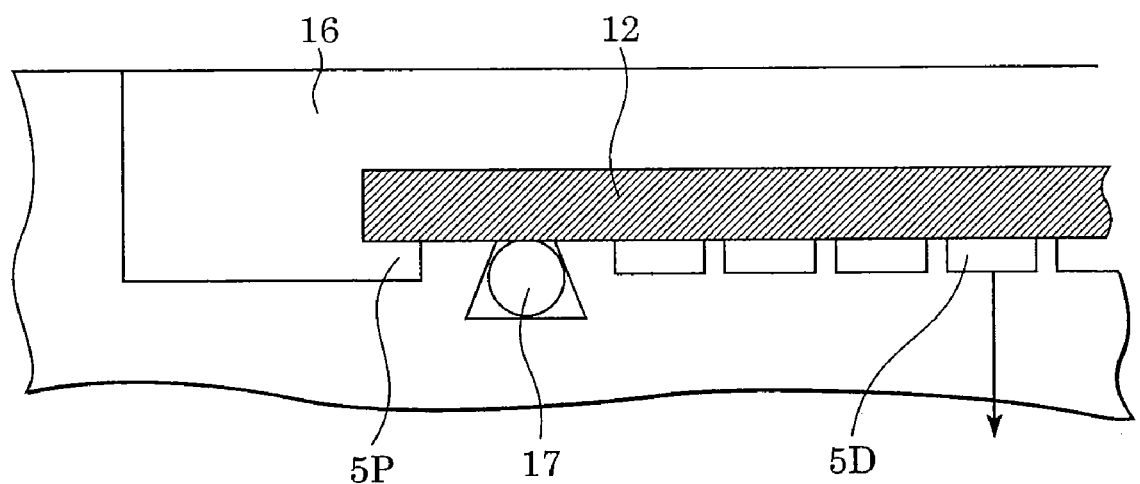
Figure 2:
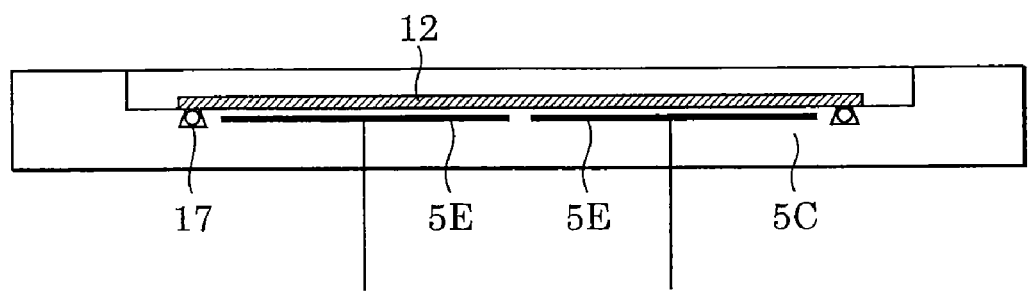
FIG. 2 is a cross-sectional view illustrating a wafer chuck provided with an electrostatic-chuck component and the sealing unit shown in FIG. 1.
Figure 12A:
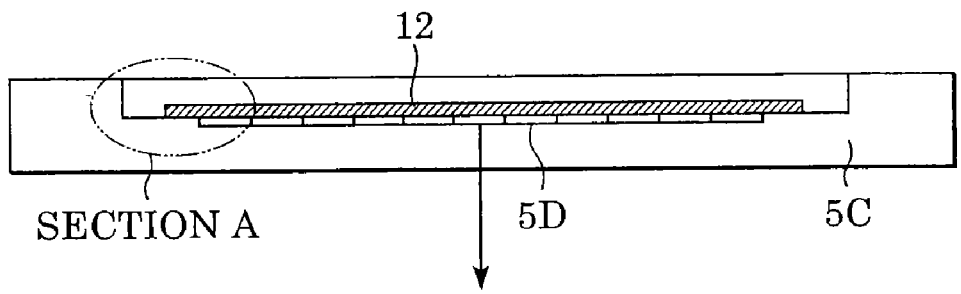
FIGS. 12A and 12B are cross-sectional views illustrating an example of a typical wafer chuck provided in the exposure apparatus shown in FIG. 9.

FIG. 1A illustrates a detachable wafer chuck 5C, i.e., a substrate holder, according to a first embodiment of the present invention. FIG. 1B is an enlarged view of section A in FIG. 1A. The wafer chuck 5C of the first embodiment corresponds to the structure shown in FIG. 12, but is additionally provided with an O-ring sealant 17, i.e., an elastic sealing member, which is in contact with the undersurface of the wafer 12. Specifically, the O-ring sealant 17 is disposed along the periphery of the undersurface of the wafer 12 while being in contact with an inner peripheral portion of the undersurface of the wafer 12.

Figure 12B:
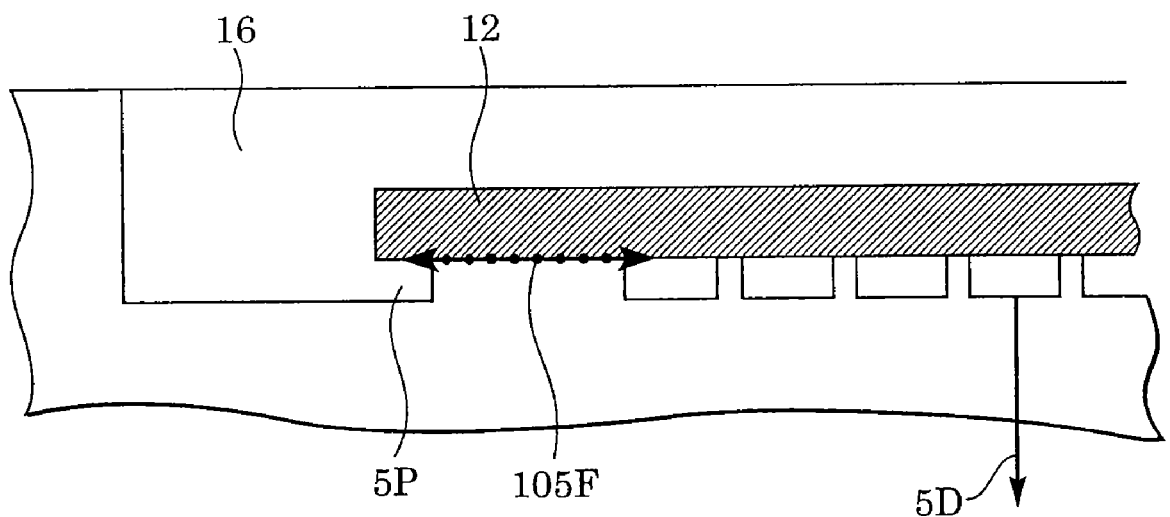
Figure 13:
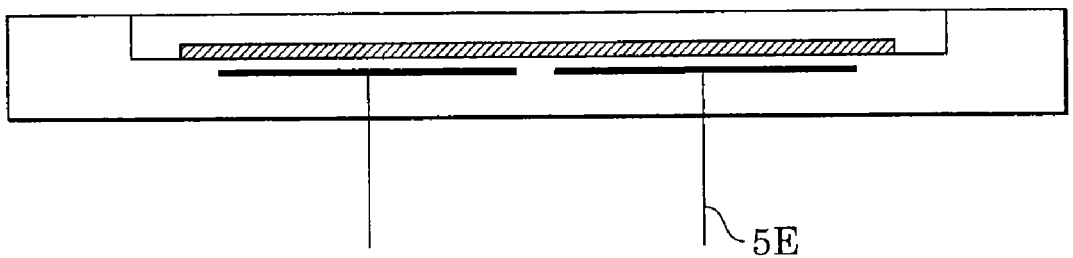
FIG. 13 is a cross-sectional view illustrating another example of a typical wafer chuck provided in the exposure apparatus shown in FIG. 9.

A structure for preventing a leakage of immersion liquid to a wafer suction unit will now be described with reference to FIGS. 1A and 1B. In FIGS. 1A and 1B, a vacuum-chuck component 5D provided in the wafer chuck 5C vacuums the wafer 12 so as to fixedly support the wafer 12. As shown in FIG. 1B, the O-ring sealant 17 is disposed adjacent to a circumferential projection (a ring-shaped projection) 5P provided along the outermost portion of the vacuum-chuck component 5D. By providing the O-ring sealant 17, the leakage 105F shown in FIG. 12B is prevented even if foreign matter attaches to the surface of the wafer chuck 5C and/or the undersurface of the wafer 12, or if a scratch is present on the surface of the wafer chuck 5C and/or the undersurface of the wafer 12. Thus, the O-ring sealant 17 prevents the immersion liquid 16 from entering the openings provided in the vacuum-chuck component 5D or prevents vacuum errors from occurring. Consequently, this prevents problems, such as lowering of the liquid level of the layer of the immersion liquid 16.

The first embodiment may additionally be provided with a detector which detects a leakage through the O-ring sealant 17, i.e., the elastic sealing member, based on, for example, air pressure or air volume in a case in which a leakage occurs through the O-ring sealant 17. If the detector detects such a leakage, the wafer 12 or the wafer chuck 5C holding the wafer 12 may be ejected from, for example, the wafer stage 5 or the exposure apparatus without supplying any immersion liquid 16 to the wafer 12. Alternatively, the first embodiment may additionally be provided with a detector for detecting a leakage through the O-ring sealant 17 just after the start of the supply of the immersion liquid 16; and a drier for drying the interior of the wafer chuck 5C. In such a case, if a leakage is detected, the drier dries the interior of the wafer chuck 5C.

Second Embodiment

Figure 3A:
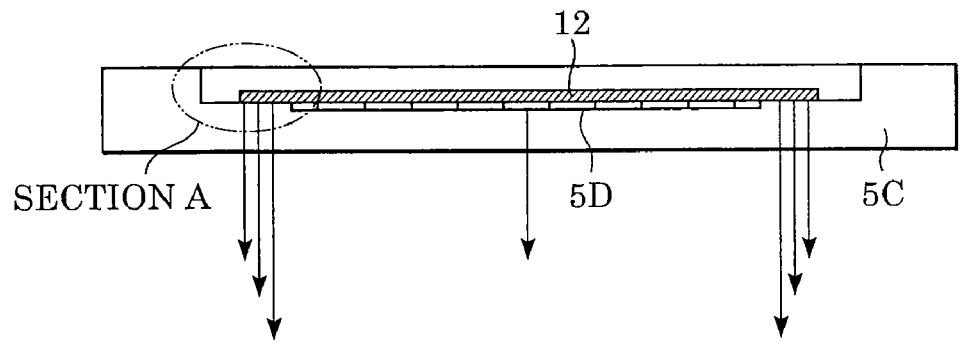
FIGS. 3A to 3C are cross-sectional views each illustrating a wafer chuck provided with a sealing unit for preventing immersion-liquid leakage according to a second embodiment of the present invention.
Figure 3B:
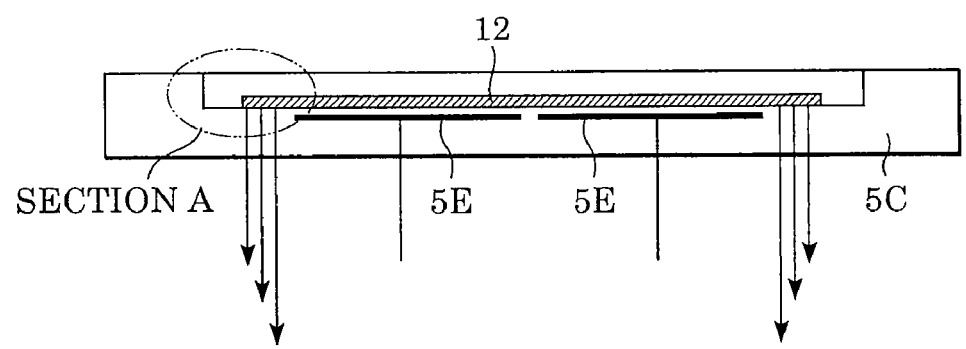
Figure 3C:
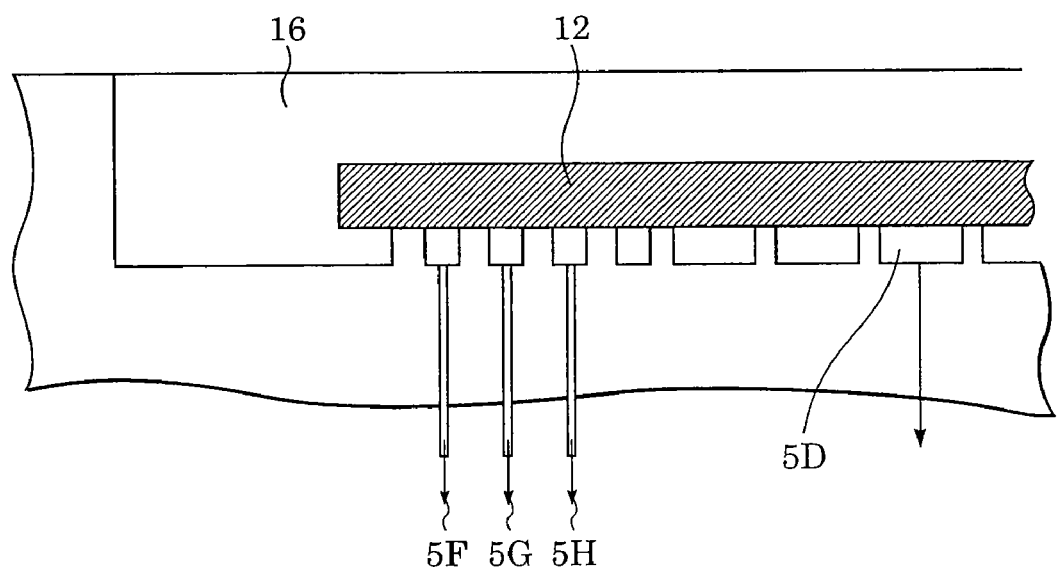

FIGS. 3A to 3C illustrate a second embodiment of the present invention. In place of the elastic O-ring sealant 17 provided in the first embodiment, the second embodiment is provided with a differential exhaust unit. Specifically, the differential exhaust unit is disposed along a periphery of a wafer-suction surface of the wafer chuck 5C while facing the inner peripheral portion of the undersurface of the wafer 12.

Referring to FIG. 3C, the differential exhaust unit is disposed along the outermost portion of the vacuum-chuck component 5D in a ring-like manner. The differential exhaust unit includes an exhaust duct A (5F), an exhaust duct B (5G), and an exhaust duct C (5H), which are independent of one another.

According to the second embodiment, the exhaust duct A (5F) is used for atmospheric pressure, the exhaust duct B (5G) is used for low vacuum pressure (intermediate pressure), and the exhaust duct C (5H) is used for suction-holding pressure. Consequently, by gradually decreasing the exhaust pressure towards the exterior of the wafer chuck 5C using multiple differential exhaust ducts, a leakage is thoroughly prevented from occurring. This prevents the immersion liquid 16 from entering the vacuum-chuck component 5D or prevents vacuum errors from occurring even if foreign matter attaches to the surface of the wafer chuck 5C and/or the undersurface of the wafer 12, or if a scratch is present on the surface of the wafer chuck 5C and/or the undersurface of the wafer 12. As a result, the leakage 105F shown in FIG. 12B is prevented from occurring, meaning that the immersion liquid 16 is prevented from entering the openings provided in the vacuum-chuck component 5D or that vacuum errors are prevented from occurring. Consequently, this prevents problems, such as lowering of the liquid level of the layer of the immersion liquid 16.

FIG. 3B illustrates an example in which the wafer suction unit according to the second embodiment includes the electrostatic-chuck component 5E in place of the vacuum-chuck component 5D. Even in this case, like the structure described above, the differential exhaust unit used in the electrostatic technique prevents the immersion liquid 16 from entering the undersurface of the wafer 12 so as to prevent problems related to the leakage of the immersion liquid 16.

Third Embodiment

Figure 4A:
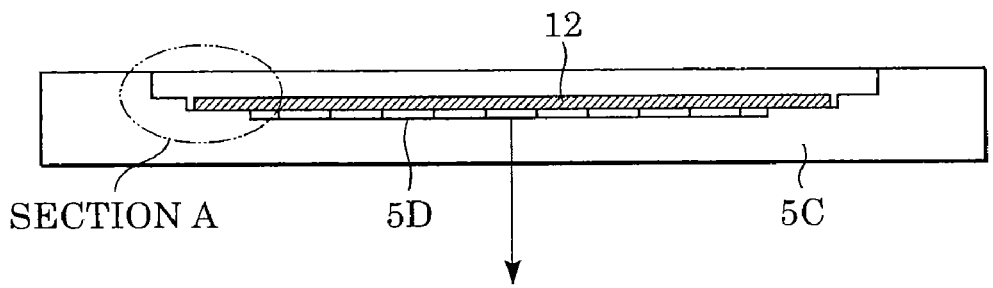
FIGS. 4A to 4C are cross-sectional views each illustrating a wafer chuck provided with a sealing unit for preventing immersion-liquid leakage according a third embodiment of the present invention.
Figure 4B:
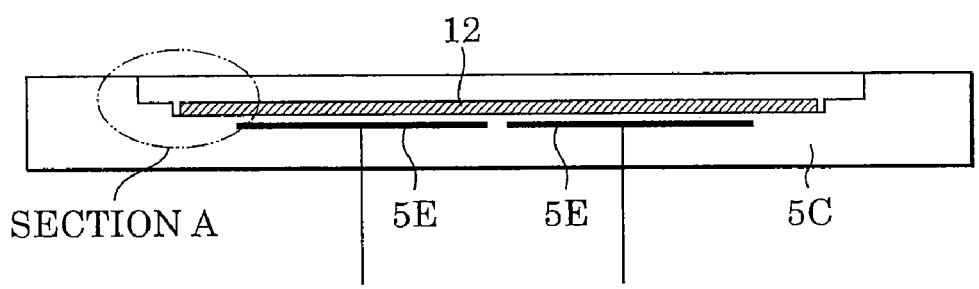
Figure 4C:
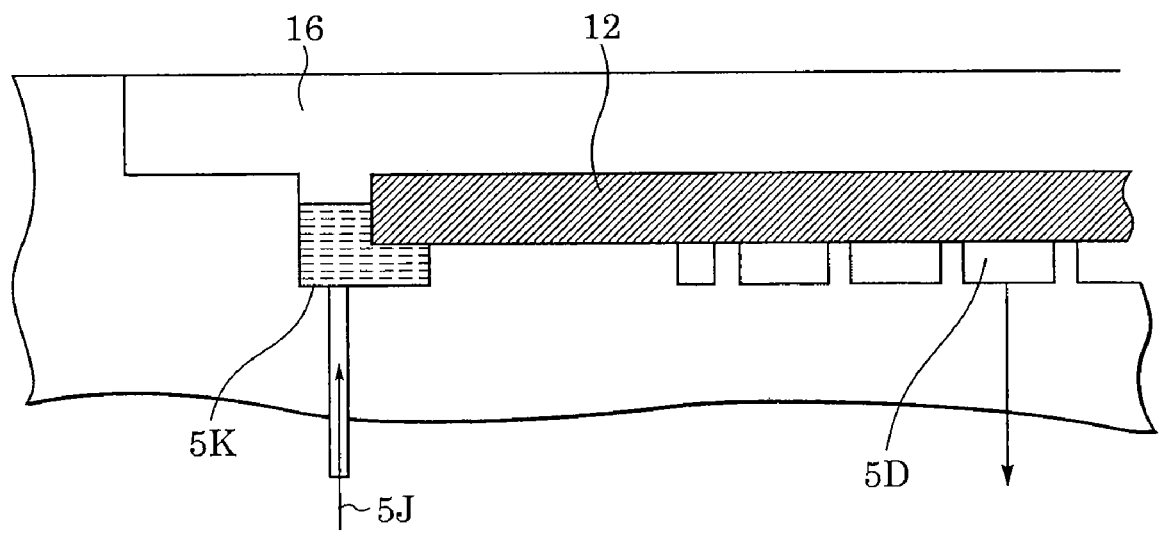

FIGS. 4A to 4C illustrate a third embodiment of the present invention. In place of the elastic O-ring sealant 17 in the first embodiment, the third embodiment is provided with a liquid-sealant pool disposed along an outer peripheral portion of the wafer chuck 5C.

Referring to FIG. 4C, a circumferential liquid-sealant groove 5K is disposed around the outer periphery of the vacuum-chuck component 5D. Moreover, a liquid-sealant supplier for supplying a liquid sealant 5J to the liquid-sealant groove 5K is also provided. The liquid sealant 5J should be formed of a material that cannot be easily diffused into the immersion liquid 16 while still having sealability. For this reason, the liquid sealant 5J may be a fluorinated inert refrigerant, fluorinated oil, or a gelatinous polymer material.

FIG. 4B illustrates an example in which the wafer suction unit according to the third embodiment includes the electrostatic-chuck component 5E in place of the vacuum-chuck component 5D. Even in this case, as with the structure described above, the liquid-sealant groove 5K and the liquid-sealant supplier used in the electrostatic technique prevent the immersion liquid 16 from entering the undersurface of the wafer 12 so as to prevent problems related to the leakage of the immersion liquid 16.

Fourth Embodiment

Figure 5A:
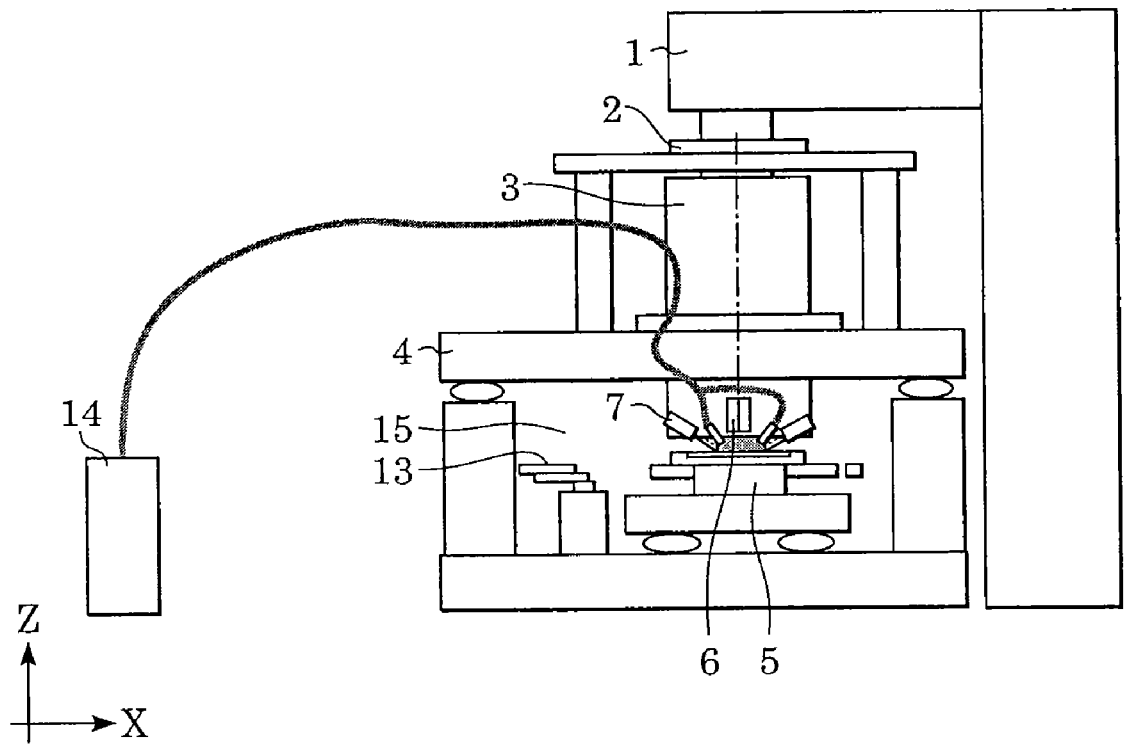
FIGS. 5A and 5B are schematic diagrams each illustrating a local-fill liquid-immersion exposure apparatus according to a fourth embodiment of the present invention.
Figure 5B:
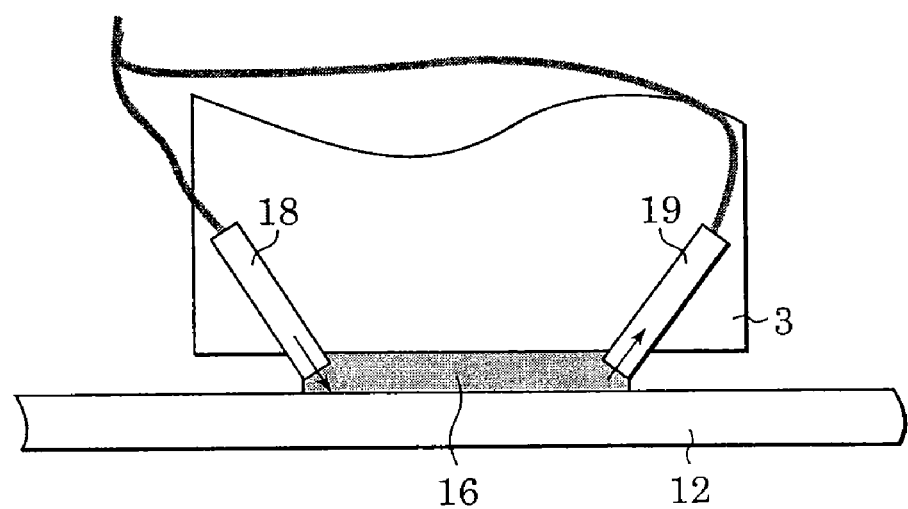

In the first to third embodiments, the entire wafer 12 is immersed in the immersion liquid 16 during the liquid-immersion exposure operation. On the other hand, a fourth embodiment of the present invention shown in FIGS. 5A and 5B provides a liquid-immersion exposure apparatus in which the immersion liquid 16 from the immersion-liquid tank 14 is supplied only to an area directly below the step-and-repeat lens 3, which is the area subject to the exposure operation. According to such a technique, the immersion liquid 16 is supplied via a liquid-supplying nozzle 18 to the area on the top surface of the wafer 12 directly below the step-and-repeat lens 3. The immersion liquid 16 is continuously supplied via the liquid-supplying nozzle 18 and is continuously retrieved from a liquid-retrieving nozzle 19.

The liquid-immersion exposure apparatus of the fourth embodiment, which supplies the immersion liquid 16 only to the area on the wafer 12 subject to the exposure operation, achieves the same effect as that achieved by the liquid-blocking sealant structure according to the first to third embodiments. The fourth embodiment is advantageous, especially in a case in which an outer region of the wafer 12 is subject to the exposure operation.

Fifth Embodiment

Figure 6A:
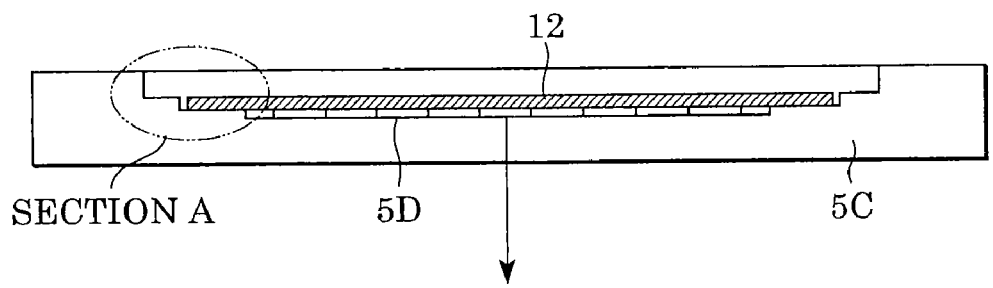
FIGS. 6A to 6C are cross-sectional views each illustrating a wafer chuck provided with a sealing unit for preventing immersion-liquid leakage according to a fifth embodiment of the present invention.
Figure 6B:
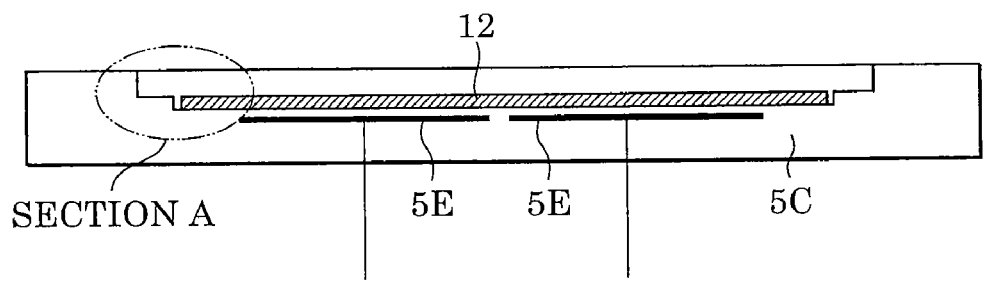
Figure 6C:
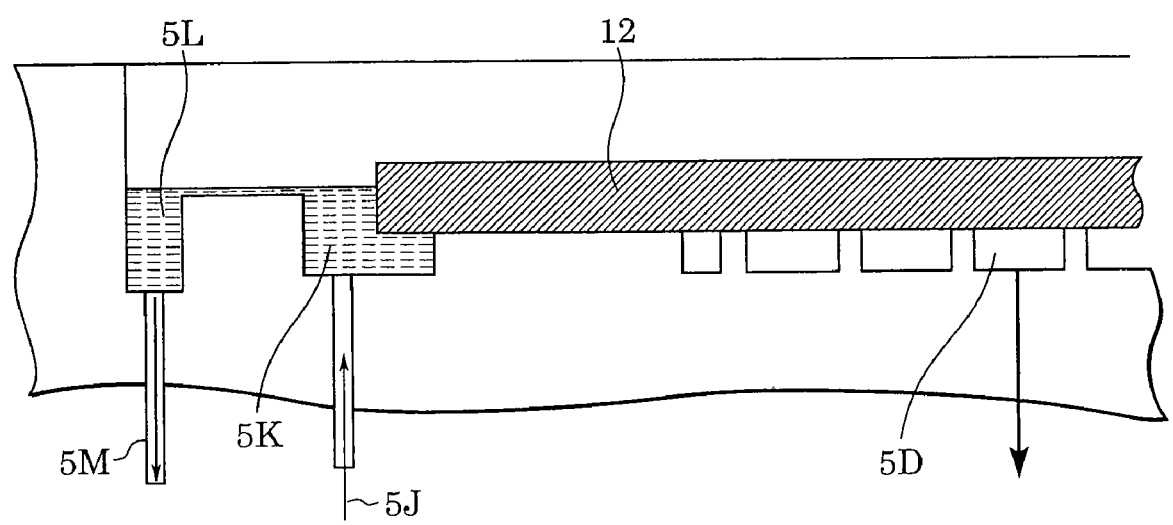

FIGS. 6A to 6C illustrate a fifth embodiment of the present invention. The fifth embodiment is provided with the circumferential liquid-sealing groove 5K around the outer periphery of the vacuum-chuck component 5D in the wafer chuck 5C as in the third embodiment, but unlike the third embodiment, the entire wafer 12 is not immersed in the immersion liquid 16. Instead, like the fourth embodiment, the immersion liquid 16 is supplied only to the area subject to the exposure operation, which is directly below the step-and-repeat lens 3.

Referring to FIG. 6C, in the fifth embodiment, the liquid-sealant supplier (including a liquid-sealant supplying duct) and the circumferential liquid-sealing groove 5K are disposed around the outer periphery of the vacuum-chuck component 5D. Moreover, a circumferential liquid-sealant-exhaust groove 5L is disposed around the outer periphery of the liquid-sealant groove 5K. The liquid sealant 5J is supplied to the liquid-sealant groove 5K, and is then discharged into a liquid-sealant exhaust duct 5M via the liquid-sealant exhaust groove 5L. In this case, the liquid sealant 5J is supplied at a constant rate of flow so as to maintain a predetermined liquid level of the liquid sealant 5J. An excess amount of the liquid sealant 5J is transferred to the liquid-sealant exhaust groove 5L, and is then discharged into the liquid-sealant exhaust duct 5M connected to the liquid-sealant exhaust groove 5L.

Furthermore, in order to completely remove the liquid sealant 5J, both the liquid-sealant supplier of the liquid sealant 5J (including the liquid-sealant supplying duct) and the liquid-sealant exhaust duct 5M may be vacuumed.

According to the first to fifth embodiments, the elastic O-ring sealant 17, the differential exhaust unit, or the liquid-sealant groove 5K is provided between the undersurface of the wafer 12 and the wafer chuck 5C, i.e., the wafer suction unit. Thus, a substrate-holding technique that prevents the immersion liquid 16 from entering the undersurface of the wafer 12, i.e., a substrate, is provided. This prevents leakages of the immersion liquid 16 into the wafer suction unit, and can prevent problems that may occur in the liquid-immersion exposure apparatus, such as a substrate suction error, an error in the wafer chuck 5C caused by a leakage of voltage, or an error due to lack of immersion liquid 16. Accordingly, a liquid-immersion exposure apparatus with high reliability and productivity can be provided.

Sixth Embodiment

Figure 7:
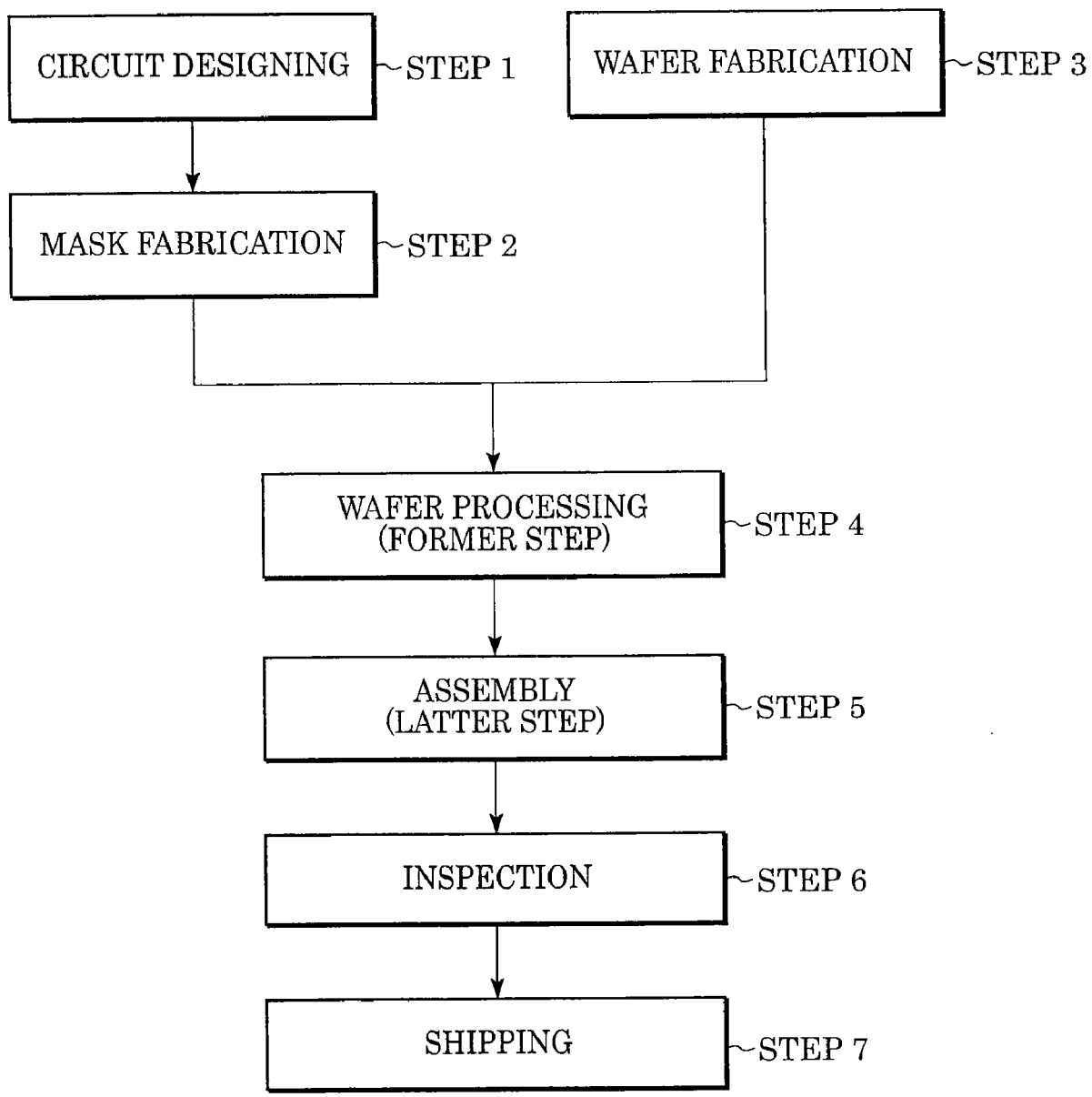
FIG. 7 is a flow chart illustrating a method for fabricating a device according to the present invention.

Referring to FIG. 7, a sixth embodiment of the present invention will now be described. FIG. 7 is a flow chart illustrating a method for fabricating a micro-device using the above-mentioned liquid-immersion exposure apparatus. Such a micro-device may include, for example, a semiconductor chip, such as an IC and an LSI, a liquid-crystal panel, a CCD, a thin-film magnetic head, or a micro-machine. In step 1, pattern designing (circuit designing) of a micro-device is performed. In step 2, a mask of the designed pattern is fabricated (mask fabrication). In step 3, a wafer is fabricated using, for example, silicon or glass (wafer fabrication). Step 4 is called a former step in which an actual circuit is formed on the wafer by lithography using the mask fabricated in step 2 (wafer processing). Step 5 is called a latter step in which the wafer processed in step 4 is made into a semiconductor chip (assembly process). Specifically, step 5 includes sub-steps, such as an assembly sub-step (dicing, bonding) and a packaging sub-step (chip enclosing). Subsequently, a step 6 is an inspection step in which the semiconductor micro-device formed in step 5 is inspected for, for example, operability and durability. The fabrication process of the micro-device is thus completed, and in step 7, the micro-device is shipped.

Figure 8:
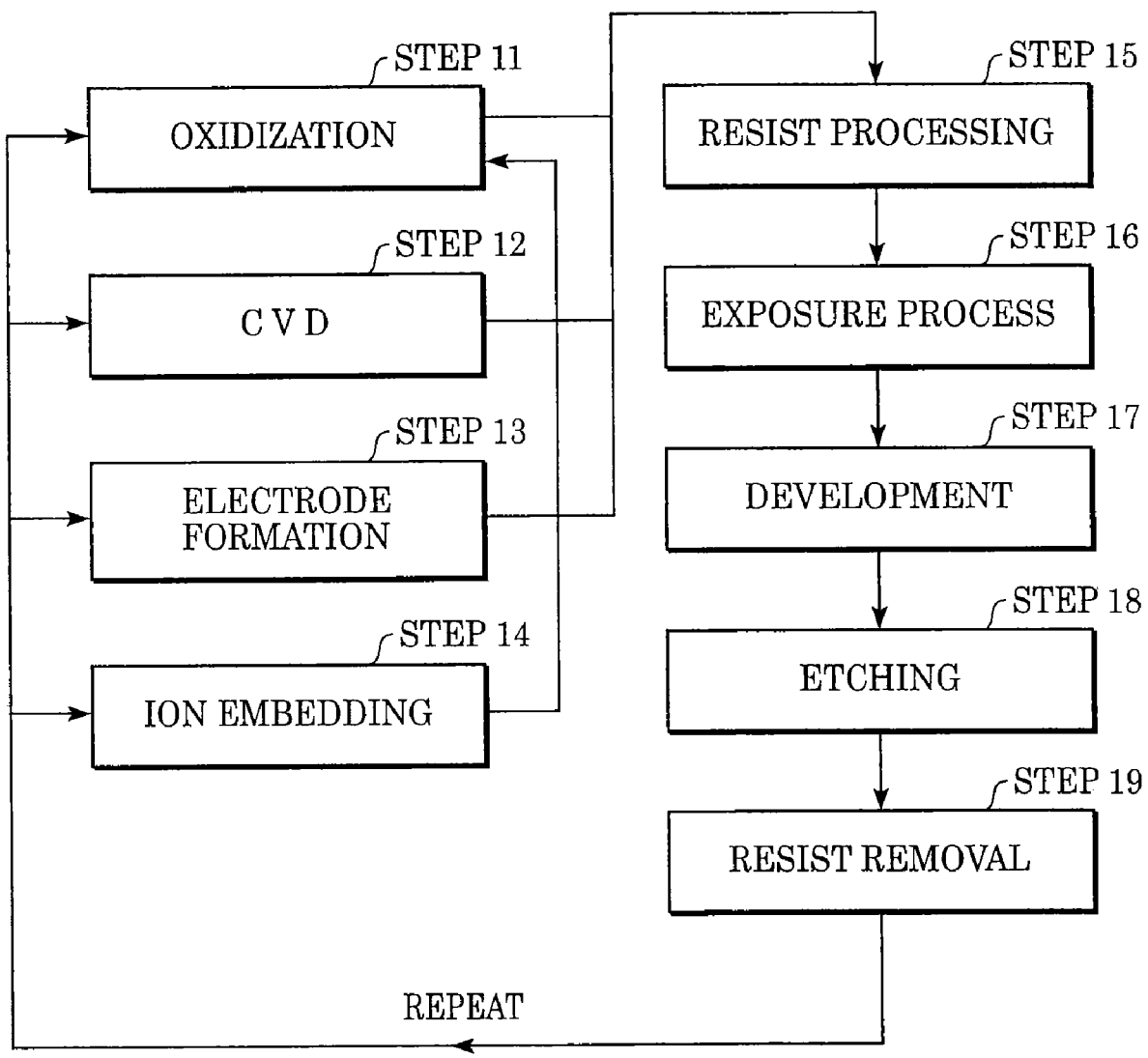
FIG. 8 is a flow chart illustrating a wafer-processing step, which is one of the steps included in the method shown in FIG. 7.
Figure 9:
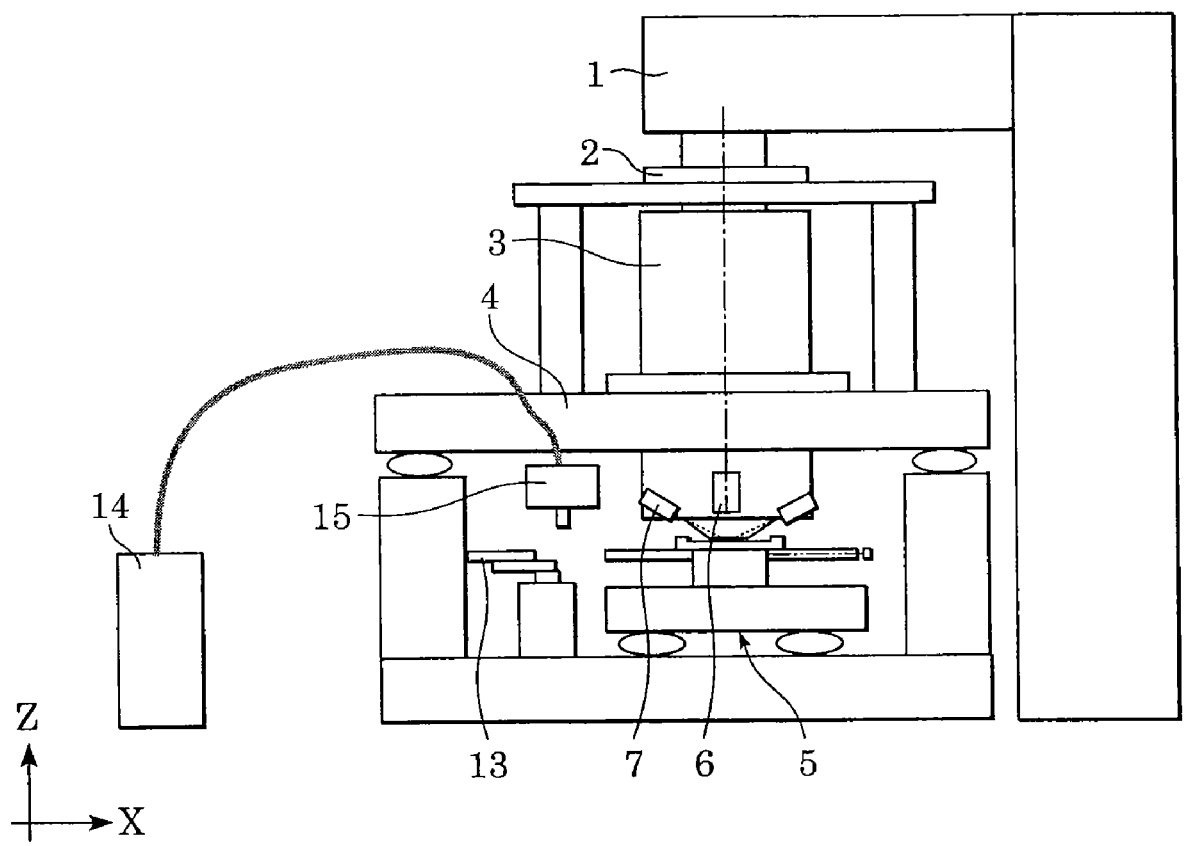
FIG. 9 is a schematic diagram of a typical liquid-immersion exposure apparatus of a movable-pool type, to which the present invention can be applied.
Figure 10:
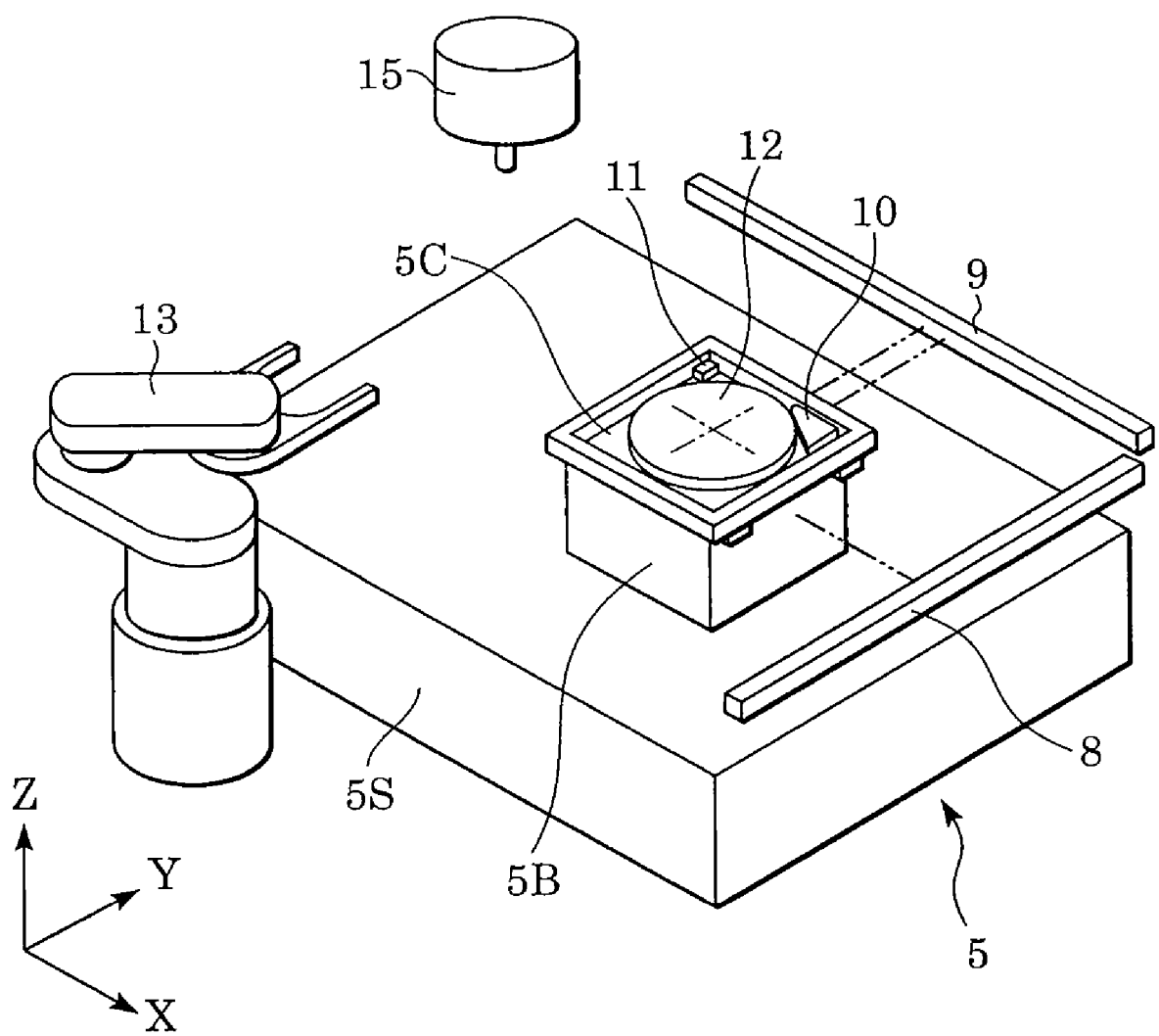
FIG. 10 is a schematic perspective view of a wafer stage included in the exposure apparatus shown in FIG. 9.
Figure 11A:
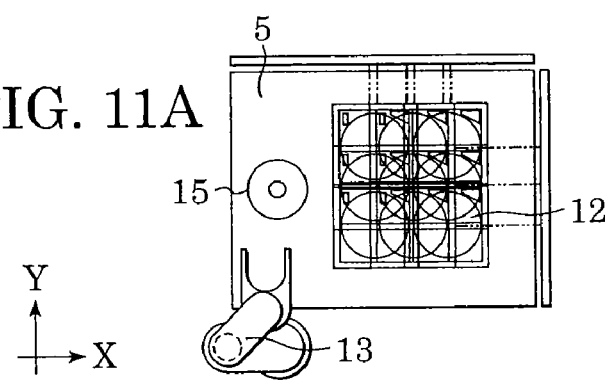
Figure 11E:
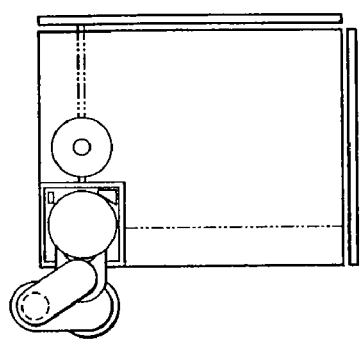
Figure 11B:
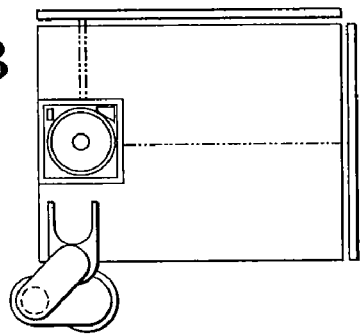
Figure 11F:
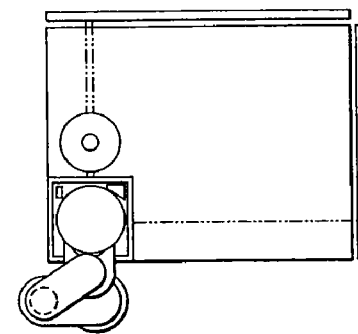
Figure 11C:
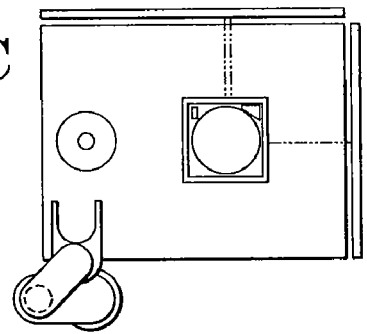
Figure 11G:
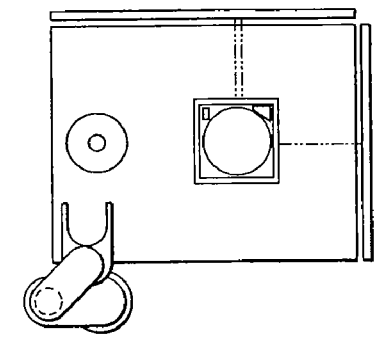
Figure 11D:
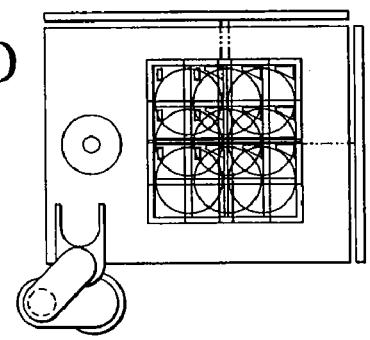

FIG. 8 is a flow chart illustrating the wafer processing step, i.e., step 4, in further detail. In step 11, the surface of the wafer is oxidized (oxidization). In step 12, an insulating layer is formed over the wafer (CVD). In step 13, an electrode is formed on the wafer by vapor deposition (electrode formation). In step 14, ions are embedded into the wafer (ion embedding). In step 15, a sensitizer is applied over the wafer (resist processing). In step 16, the circuit pattern of the mask is exposed and printed onto the wafer by using the exposure apparatus described above (exposure process). In step 17, the wafer having the circuit pattern disposed thereon is developed (development process). In step 18, segments on the wafer other than the developed resist segments are etched (etching process). In step 19, the resist segments no longer needed after the etching process are removed (resist removal). By repeating these steps, a multilayer circuit pattern is formed on the wafer. By using the fabrication method according to the sixth embodiment, a highly-integrated micro-device can be manufactured at a low cost.

Other aspects of the present invention will now be described.

Aspect 1. A liquid-immersion exposure apparatus according to Aspect 1 projects a pattern included in an original onto a substrate and operates a stage unit in order to move both the original and the substrate or only the substrate relatively with respect to an optical projection unit. Thus, the pattern of the original is repeatedly exposed on the substrate while an immersion-liquid layer is disposed in at least a part of a light-transmitting space between the optical projection unit and the substrate.

The liquid-immersion exposure apparatus according to Aspect 1 is provided with a blocking unit disposed between the immersion-liquid layer and a substrate suction unit provided in a substrate holder. The blocking unit prevents a leakage of the immersion liquid by substantially blocking the immersion-liquid layer from the substrate suction-surface or the substrate suction unit.

There are generally two types of liquid-immersion exposure apparatuses. One is a movable-pool type in which a wafer, i.e., the substrate, is completely immersed in the immersion liquid. The other is a local-fill type in which the wafer is partially immersed in the immersion liquid such that a region in the wafer with the immersion liquid can be shifted. The present invention can be applied to either type.

The blocking unit is preferably ring-shaped such that the blocking unit substantially surrounds the undersurface of the substrate. In other words, if the substrate is circular, the blocking unit is circular, and if the substrate is rectangular, the blocking unit is also rectangular so that the blocking unit can be disposed along the periphery of the substrate. For example, an elastic sealing member is used as the blocking unit.

The blocking unit may include at least one of the elastic sealing member, at least one circumferential exhaust duct, and a liquid-sealant supplier. Specifically, the elastic sealing member is in contact with the periphery of the substrate and/or an inner portion of the undersurface of the substrate positioned along the periphery of the substrate (referred to as an inner peripheral portion hereinafter) when the substrate is being held by the substrate holder. On the other hand, at least one circumferential exhaust duct is disposed on the substrate-holding surface of the substrate holder and faces the inner peripheral portion of the undersurface of the substrate when the substrate is being held by the substrate holder. The liquid-sealant supplier supplies liquid that does not mix with the immersion liquid along the periphery of the substrate and/or the inner peripheral portion of the undersurface of the substrate when the substrate is being held by the substrate holder.

Aspect 2. According to the exposure apparatus of Aspect 1, the blocking unit is preferably the elastic sealing member, which is in contact with the substrate.

Aspect 3. According to the exposure apparatus of one of Aspects 1 and 2, the blocking unit or the elastic sealing member is detachably disposed on the substrate holder.

Aspect 4. According to the exposure apparatus of Aspect 1, the blocking unit may include at least one circumferential exhaust duct disposed on the substrate-holding surface of the substrate holder. At least one circumferential exhaust duct preferably includes a plurality of circumferential exhaust ducts so as to define a differential exhaust unit.

Aspect 5. According to the exposure apparatus of Aspect 1, the blocking unit may include the liquid-sealant supplier for supplying a liquid sealant substantially along the outer peripheries of the substrate holder and the substrate.

Aspect 6. According to the exposure apparatus of Aspect 5, the density of the liquid sealant supplied along the outer peripheries of the substrate holder and the substrate is greater than that of the immersion liquid.

Aspect 7. According to the exposure apparatus of Aspect 5, the liquid sealant supplied along the outer peripheries of the substrate holder and the substrate is retrieved or discharged respectively by a retrieving unit or a drainage unit provided in the substrate holder.

Aspect 8. According to the exposure apparatus of one of Aspects 1 to 7, the substrate holder is detachably disposed on the stage unit.

Accordingly, by providing the blocking unit, such as the elastic sealing member, the differential exhaust unit and the liquid-sealant supplier, between the substrate holder and the substrate, the immersion liquid is prevented from entering the substrate suction unit so as to prevent leakages.

While the present invention has been described with reference to what are at present considered to be the preferred embodiments, it is to be understood that the invention is not limited to the disclosed embodiments. On the contrary, the invention is intended to cover various modifications and equivalent arrangements included with the spirit and scope of the appended claims. The scope of the following claims is to be accorded the broadest interpretation so as to encompass all such modifications and equivalent structures and functions.

What is claimed is:

1. A substrate holding apparatus which contacts an undersurface of a substrate and holds the substrate, at least a portion of a top surface of the substrate being immersed in an immersion liquid, said apparatus comprising:
    a chuck unit for supporting the substrate;
    a sealant groove, arranged along an outer periphery of a substrate supporting surface of said chuck unit, for storing a liquid sealant for preventing the immersion liquid from reaching the undersurface of the substrate, wherein the liquid sealant is a fluorinated inert refrigerant, fluorinated oil or a gelatinous polymer material;
    a supply unit to supply the liquid sealant to said sealant groove;
    an exhaust groove disposed around the outer periphery of said sealant groove; and
    an exhaust duct connected to said exhaust groove for discharging the liquid sealant supplied by said supply unit and stored in said exhaust groove.

2. An apparatus according to claim 1, wherein three exhaust ducts are arranged along the periphery of the substrate supporting surface of said chuck unit.

3. An exposure apparatus comprising:
    (a) a projection optical system for projecting a pattern of an original onto a substrate;
    (b) a liquid application device for applying an immersion liquid to the substrate; and
    (c) a substrate holding apparatus which contacts an undersurface of the substrate and holds the substrate, at least a portion of a top surface of the substrate being immersed in the immersion liquid, said substrate holding apparatus comprising:
        (i) a chuck unit for supporting the substrate;
        (ii) a sealant groove, arranged along an outer periphery of a substrate supporting surface of said chuck unit, for storing a liquid sealant for preventing the immersion liquid from reaching the undersurface of the substrate, wherein the liquid sealant is a fluorinated inert refrigerant, fluorinated oil or a gelatinous polymer material;
        (iii) a supply unit to supply the liquid sealant to said sealant groove;
        (iv) an exhaust groove disposed around the outer periphery of said sealant groove; and
        (v) an exhaust duct connected to said exhaust groove for discharging the liquid sealant supplied by said supply unit and stored in said exhaust groove.

4. A method of manufacturing a device, comprising the steps of:
    providing a projection optical system for projecting a pattern of an original onto a substrate;
    providing a substrate holding apparatus which contacts an undersurface of the substrate and holds the substrate, at least a portion of a top surface of the substrate being immersed in an immersion liquid;
    applying the immersion liquid to the substrate;
    storing, in a sealant groove, arranged along an outer periphery of a substrate supporting surface of the substrate holding apparatus, a liquid sealant for preventing the immersion liquid from reaching the undersurface of the substrate, wherein the liquid sealant is a fluorinated inert refrigerant, fluorinated oil or a gelatinous polymer material; and
    providing (i) a supply unit to supply the liquid sealant to the sealant groove, (ii) an exhaust groove disposed around the outer periphery of the sealant groove, and (iii) an exhaust duct connected to the exhaust groove for discharging the liquid sealant stored in the exhaust groove.

* * * * *